United States Patent
Cheng et al.

(10) Patent No.: US 11,289,540 B2
(45) Date of Patent: *Mar. 29, 2022

(54) SEMICONDUCTOR DEVICE AND MEMORY CELL

(71) Applicant: MACRONIX INTERNATIONAL CO., LTD., Hsinchu (TW)

(72) Inventors: Huai-Yu Cheng, White Plains, NY (US); I-Ting Kuo, Taoyuan (TW); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/205,767

(22) Filed: Mar. 18, 2021

(65) Prior Publication Data

US 2021/0210554 A1 Jul. 8, 2021

Related U.S. Application Data

(63) Continuation-in-part of application No. 16/601,647, filed on Oct. 15, 2019, now Pat. No. 10,978,511.

(51) Int. Cl.
*H01L 27/24* (2006.01)

(52) U.S. Cl.
CPC ...... *H01L 27/2427* (2013.01); *H01L 27/2481* (2013.01)

(58) Field of Classification Search
CPC . H01L 27/2427; H01L 27/2481; H01L 45/06; H01L 45/144; H01L 45/04; H01L 45/1233; H01L 45/143; H01L 45/1683
See application file for complete search history.

(56) References Cited

U.S. PATENT DOCUMENTS

| | | | |
|---|---|---|---|
| 3,271,591 | A | 9/1966 | Ovshinsky |
| 3,343,034 | A | 9/1967 | Ovshinsky |
| 3,530,441 | A | 9/1970 | Ovshinsky |
| 3,571,669 | A | 3/1971 | Fleming |
| 3,571,670 | A | 3/1971 | Ovshinsky |
| 3,571,671 | A | 3/1971 | Ovshinsky |
| 3,571,672 | A | 3/1971 | Ovshinsky |
| 3,588,638 | A | 6/1971 | Fleming et al. |
| 3,611,063 | A | 10/1971 | Neale |
| 3,619,732 | A | 11/1971 | Neale |

(Continued)

FOREIGN PATENT DOCUMENTS

| | | |
|---|---|---|
| CN | 1568494 A | 1/2005 |
| CN | 107210302 A | 9/2017 |

(Continued)

OTHER PUBLICATIONS

U.S. Office Action in U.S. Appl. No. 16/355,292 dated Jul. 27, 2021 (and supplement dated Jul. 28, 2021), 66 pages.

(Continued)

*Primary Examiner* — Allison Bernstein
(74) *Attorney, Agent, or Firm* — Haynes Beffel & Wolfeld LLP; Andrew Dunlap

(57) ABSTRACT

An ovonic threshold switch includes a first electrode, a second electrode, and an In-doped chalcogenide-based selector layer disposed between the first electrode and the second electrode, in which the In-doped chalcogenide-based selector layer has an In compound content of about 2 at. % to about 10 at. %. A memory cell including the In-doped chalcogenide-based selector layer is also provided.

14 Claims, 12 Drawing Sheets

(56) References Cited

U.S. PATENT DOCUMENTS

| | | | |
|---|---|---|---|
| 3,656,032 A | 4/1972 | Henisch | |
| 3,846,767 A | 11/1974 | Cohen | |
| 3,875,566 A | 4/1975 | Helbers | |
| 3,886,577 A | 5/1975 | Buckley | |
| 3,980,505 A | 9/1976 | Buckley | |
| 5,159,661 A | 10/1992 | Ovshinsky et al. | |
| 5,177,567 A | 1/1993 | Klersy et al. | |
| 5,687,112 A | 11/1997 | Ovshinsky | |
| 6,579,760 B1 | 6/2003 | Lung | |
| 6,800,504 B2 | 10/2004 | Li et al. | |
| 6,967,344 B2 | 11/2005 | Ovshinsky et al. | |
| 6,995,390 B2 | 2/2006 | Tsukui | |
| 7,483,293 B2 | 1/2009 | Pinnow et al. | |
| 7,688,619 B2 | 3/2010 | Lung | |
| 7,893,419 B2 | 2/2011 | Hudgens et al. | |
| 7,902,538 B2 | 3/2011 | Lung | |
| 7,903,457 B2 | 3/2011 | Lung | |
| 7,929,340 B2 | 4/2011 | Lung et al. | |
| 8,138,028 B2 | 3/2012 | Lung et al. | |
| 8,148,707 B2 | 4/2012 | Ovshinsky | |
| 8,178,387 B2 | 5/2012 | Cheng et al. | |
| 8,315,088 B2 | 11/2012 | Lung | |
| 8,324,605 B2 | 12/2012 | Lung et al. | |
| 8,330,137 B2 | 12/2012 | Schrott et al. | |
| 8,344,348 B2 | 1/2013 | Wicker | |
| 8,363,463 B2 | 1/2013 | Shih et al. | |
| 8,374,019 B2 | 2/2013 | Wu et al. | |
| 8,410,468 B2 | 4/2013 | Zheng | |
| 8,426,242 B2 | 4/2013 | Cheng et al. | |
| 8,467,236 B2 | 6/2013 | Campbell | |
| 8,634,235 B2 | 1/2014 | Lung | |
| 8,646,666 B2 | 2/2014 | May | |
| 8,772,747 B2 | 7/2014 | Cheng et al. | |
| 8,916,414 B2 | 12/2014 | Cheng et al. | |
| 8,932,901 B2 | 1/2015 | Cheng | |
| 8,946,666 B2 | 2/2015 | Cheng et al. | |
| 9,177,640 B2 | 11/2015 | Shintani et al. | |
| 9,190,609 B2 | 11/2015 | Zheng | |
| 9,214,229 B2 | 12/2015 | Cheng et al. | |
| 9,336,879 B2 | 5/2016 | Lung et al. | |
| 9,337,421 B2 | 5/2016 | Chin et al. | |
| 9,659,998 B1 | 5/2017 | Lung | |
| 9,917,252 B2 | 3/2018 | Cheng et al. | |
| 10,050,196 B1 | 8/2018 | Cheng et al. | |
| 10,157,671 B1 | 12/2018 | Lung et al. | |
| 10,256,406 B2 | 4/2019 | Collins et al. | |
| 10,374,009 B1 | 8/2019 | Cheng et al. | |
| 10,541,271 B2 | 1/2020 | Cheng et al. | |
| 10,593,875 B2 | 3/2020 | Lai et al. | |
| 10,978,511 B1 | 4/2021 | Cheng et al. | |
| 11,158,787 B2 | 10/2021 | Cheng et al. | |
| 2005/0018098 A1 | 1/2005 | Sugihara et al. | |
| 2007/0171705 A1 | 7/2007 | Parkinson | |
| 2008/0142777 A1 | 6/2008 | Park et al. | |
| 2008/0253166 A1 | 10/2008 | Raberg et al. | |
| 2008/0272807 A1 | 11/2008 | Lowrey | |
| 2009/0014705 A1 | 1/2009 | Hsu et al. | |
| 2009/0194759 A1 | 8/2009 | Chin et al. | |
| 2009/0230375 A1 | 9/2009 | Liang et al. | |
| 2010/0051895 A1 | 3/2010 | Hampton | |
| 2010/0054029 A1 | 3/2010 | Happ et al. | |
| 2010/0328996 A1 | 12/2010 | Shih et al. | |
| 2011/0049456 A1 | 3/2011 | Lung et al. | |
| 2011/0084240 A1 | 4/2011 | Schell et al. | |
| 2011/0095257 A1 | 4/2011 | Xu et al. | |
| 2011/0097825 A1 | 4/2011 | Cheng et al. | |
| 2011/0180775 A1 | 7/2011 | Lin et al. | |
| 2011/0207284 A1 | 8/2011 | Tominaga et al. | |
| 2011/0317480 A1 | 12/2011 | Lung et al. | |
| 2012/0025164 A1 | 2/2012 | Deweerd | |
| 2012/0062267 A1 | 3/2012 | Saito | |
| 2012/0181499 A1 | 7/2012 | Chuang et al. | |
| 2012/0193595 A1 | 8/2012 | Cheng et al. | |
| 2012/0326111 A1 | 12/2012 | Cheng et al. | |
| 2013/0043375 A1 | 2/2013 | Baleine et al. | |
| 2013/0105759 A1 | 5/2013 | Cheng | |
| 2013/0234093 A1 | 9/2013 | Cheng et al. | |
| 2013/0270505 A1 | 10/2013 | Dahmani | |
| 2013/0277638 A1 | 10/2013 | Moradpour et al. | |
| 2014/0101371 A1 | 4/2014 | Nguyen et al. | |
| 2014/0264240 A1 | 9/2014 | Cheng et al. | |
| 2014/0376307 A1 | 12/2014 | Shintani | |
| 2014/0376309 A1 | 12/2014 | Cheng et al. | |
| 2015/0048291 A1 | 2/2015 | Cheng et al. | |
| 2016/0276022 A1 | 9/2016 | Redaelli | |
| 2016/0336378 A1 | 11/2016 | Ohba et al. | |
| 2016/0372188 A1 | 12/2016 | Lung et al. | |
| 2016/0372661 A1 | 12/2016 | Cheng et al. | |
| 2017/0076797 A1 | 3/2017 | Lung et al. | |
| 2017/0244026 A1 | 8/2017 | Wu et al. | |
| 2017/0250222 A1 | 8/2017 | Wu et al. | |
| 2017/0263863 A1 | 9/2017 | Lung et al. | |
| 2017/0271581 A1 | 9/2017 | Seong et al. | |
| 2018/0012938 A1 | 1/2018 | Lung et al. | |
| 2018/0019391 A1 | 1/2018 | Ohba et al. | |
| 2018/0040669 A1 | 2/2018 | Wu | |
| 2018/0277601 A1 | 9/2018 | Ahn et al. | |
| 2019/0043924 A1 | 2/2019 | Conti et al. | |
| 2019/0081103 A1 | 3/2019 | Fantini et al. | |
| 2019/0115393 A1 | 4/2019 | Cheng et al. | |
| 2019/0148456 A1 | 5/2019 | Wu et al. | |
| 2019/0252609 A1 | 8/2019 | Sei et al. | |
| 2019/0355790 A1 | 11/2019 | Lung et al. | |
| 2019/0355903 A1 | 11/2019 | Lung et al. | |
| 2019/0386213 A1 | 12/2019 | Lai et al. | |
| 2019/0393268 A1 | 12/2019 | Lai et al. | |
| 2020/0052036 A1 | 2/2020 | Ikarashi et al. | |
| 2020/0227475 A1 | 7/2020 | Park et al. | |
| 2020/0295083 A1 | 9/2020 | Cheng et al. | |
| 2021/0111224 A1 | 4/2021 | Cheng et al. | |
| 2021/0143216 A1 | 5/2021 | Lai et al. | |
| 2021/0184112 A1 | 6/2021 | Cheng et al. | |
| 2021/0210554 A1 | 7/2021 | Cheng et al. | |

FOREIGN PATENT DOCUMENTS

| | | |
|---|---|---|
| TW | 201633507 A | 9/2016 |
| TW | 201700407 A | 1/2017 |
| TW | 201733177 A | 9/2017 |
| TW | 201801300 A | 1/2018 |
| TW | 201907543 A | 2/2019 |
| TW | 202006931 A | 2/2020 |
| TW | 202036850 A | 10/2020 |

OTHER PUBLICATIONS

Cheng et al., "An ultra high endurance and thermally stable selector based on TeAsGeSiSe chalcogenides compatible with BEOL IC Integration for cross-point PCM," IEEE IEDM Dec. 2-6, 2017, 4 pages.

Cheng et al., "Si Incorporation into AsSeGe Chalcogenides for High Thermal Stability, High Endurance and Extremely Low Vth Drift 3D Stackable Cross-Point Memory," IEEE Symp. on VLSI Tech., Jun. 16-19, 2020, 2 pages.

Cheng et al. , "Ultra-High Endurance and Low IOFF Selector based on AsSeGe Chalcogenides for Wide Memory Window 3D Stackable Crosspoint Memory," IEEE IEDM Dec. 1-5, 2018, 4 pages.

Guo et al., "A Review of Germanium-Antimony-Telluride Phase Change Materials for Non-Volatile Memories and Optical Modulators," Appl. Sci. Feb. 4, 2019, 26 pages; www.mdpi.com/journal/applsci.

Kao et al., "Antimony alloys for phase-change memory with high thermal stability," Scripta Materialia vol. 63, issue 8, Oct. 2010, 855-858.

Mark-Lapedus, "Embedded Phase-Change Memory Emerges," https://semiengineering.com/author/mark-lapedus, Jan. 24, 2019, 13 pages.

NIST Special Publication 800-38D, Dworkin, "Recommendation for Block Cipher Modes of Operation: Galois/Counter Mode (GCM) and GMAC," Nov. 2007, 39 pages.

Ohyanagi et al., "Special Electrical Characteristics of Superlattice Phase Change Memory," ECS Trans., vol. 58, Issue 5, Oct. 31, 2013, pp. 135-158.

(56) References Cited

OTHER PUBLICATIONS

Ovshinsky, "New Transformative Possibilities for Ovonic Devices," E*PCOS2010, European Symposium on Phase Change and Ovonic Science, Milan, Italy Sep. 6-7, 2010, 9 pages.
Schuller, Ivan K., Stevens, Rick, Pino, Robinson, and Pechan, Michael. Neuromorphic Computing—From Materials Research to Systems Architecture Roundtable. "Report of a Roundtable Convened to Consider Neuromorphic Computing Basic Research Needs," Oct. 29-30, 2015, 40 pages.
Shanks, "Ovonic threshold switching characteristics," Journal of Non-Crystalline Solids, vol. 2, Jan. 1970, pp. 504-514.
Shin et al., "The effect of doping Sb on the electronic structure and the device characteristics of Ovonic Threshold Switches based on Ge—Se," Scientific Reports, Nov. 18, 2014, 5 pages.
Simpson et al., "Interfacial phase-change memory," Nature Nanotechnology, vol. 6, Jul. 3, 2011, 502-505.
Velea et al., "Te-based chalcogenide materials for selector applications," Scientific Reports, 7:8103, Aug. 14, 2019, 12 pages.
Wikipedia, "Rutherford backscattering spectrometry," downloaded Aug. 4, 2020, available at https://en.wikipedia.org/wiki/Rutherford_backscattering_spectrometry, 8 pages.
Wu et al., "A 40nm Low-Power Logic Compatible Phase Change Memory Technology," IEEE IEDM 2018, Dec. 1-5, 2018, 4 pages.
Chen, et al., "Endurance Improvement of Ge2Sb2Te5-Based Phase Change Memory," IEEE Int'l MemoryWorkshop, 2009, May 10-14, 2009, 2 pages.
Cheng et al., "A thermally robust phase change memory by engineering the Ge/N concentration in (Ge, N)xSbyTe z phase change materiaL" 2012 Int'l IEEE IEDM, Dec. 10-13, 2012, 4 pages.
Cheng et al., "The Crystallization Behavior of Ga—Sb Materials as a Function of Composition for Phase Change Random Access Memory," Phase Change and Ovonics Symposium, Sep. 2011, 7 pages.
Cheng et al., Ga46Sb54 Material for Fast Switching and Pb-Free Soldering Reflow Process Complying Phase-Change Memory, ECS J. Solid State Sci. Technol. 2014 vol. 3, issue 7, Jun. 2014, p. 263-p. 267.
Cheng, et al., "A high performance phase change memory with fast switching speed and high temperature retention by engineering the GexSbyTez phase change material," 2011 IEEE Int'l IEDM, Dec. 5-7, 2011, 4 pages.
Cheng, H.Y., et al., "Atomic-level engineering of phase change material for novel fast-switching and high-endurance PCM for storage class memory application," IEEE Int'l Electron Devices Meeting (IEDM), Dec. 9-11, 2013, p. 30.6.1,30.6.4.
Ciocchini, N., et al. "Unified reliability modeling of Ge-rich phase change memory for embedded applications" IEEE Int'l Electron Devices Meeting (IEDM), Dec. 9-11, 2013, p. 22.1.1,22.1.4.
Kim, I.S., et al., "High performance PRAM cell scalable to sub-20nm technology with below 4F2 cell size, extendable to DRAM applications," 2010 Symp. on VLSI Technology, Jun. 15-17, 2010, 2 pages.
Lu et al., Ga14Sb86 film for ultralong data retention phase-change memory, J. Appl. Phys. 109, 064503, Jun. 2011, 4 pages.
Morales-Sanchez et al., "Structural, electric and kinetic parameters of ternary alloys of GeSbTe," Thin Solid Films, vol. 471, Issues 1-2, Jan. 3, 2005, pp. 243-247.
Navarro, G., et al., "Trade-off between SET and data retention performance thanks to innovative materials for phase-change memory," IEEE Int'l Electron Devices Meeting (IEDM), Dec. 9-11, 2013, p. 21.5.1,21.5.4.
Putero et al., Unusual crystallization behavior in Ga—Sb phase change alloys, APL Mat. 1, Jun. 21, 2001, Dec. 2013, 7 pages.
Raoux, et al. "Phase change materials and phase change memory," MRS Bulletin, 39(8), 703-710.
Shah et al., "GaSb—Ge pseudobinary phase diagram," Journal of Electronic Materials, vol. 11, Issue 1, Jan. 1982, 53-58.
U.S. Office Action in U.S. Appl. No. 17/205,767 dated Dec. 21, 2021, 11 pages.
U.S. Office Action in U.S. Appl. No. 16/833,349 dated Oct. 6, 2021, 10 pages.
Wimmer, et al., Role of activation energy in resistance drift of amorphous phase change materials, Frontiers in Physics, Dec. 2014, vol. 2, Article 75, pp. 1-12.
Zuliani, P., et al., "Overcoming Temperature Limitations in Phase Change Memories With Optimized GexSbyTez," IEEE Trans, on Electron Devices, 60(12), Dec. 2013, pp. 4020,4026.

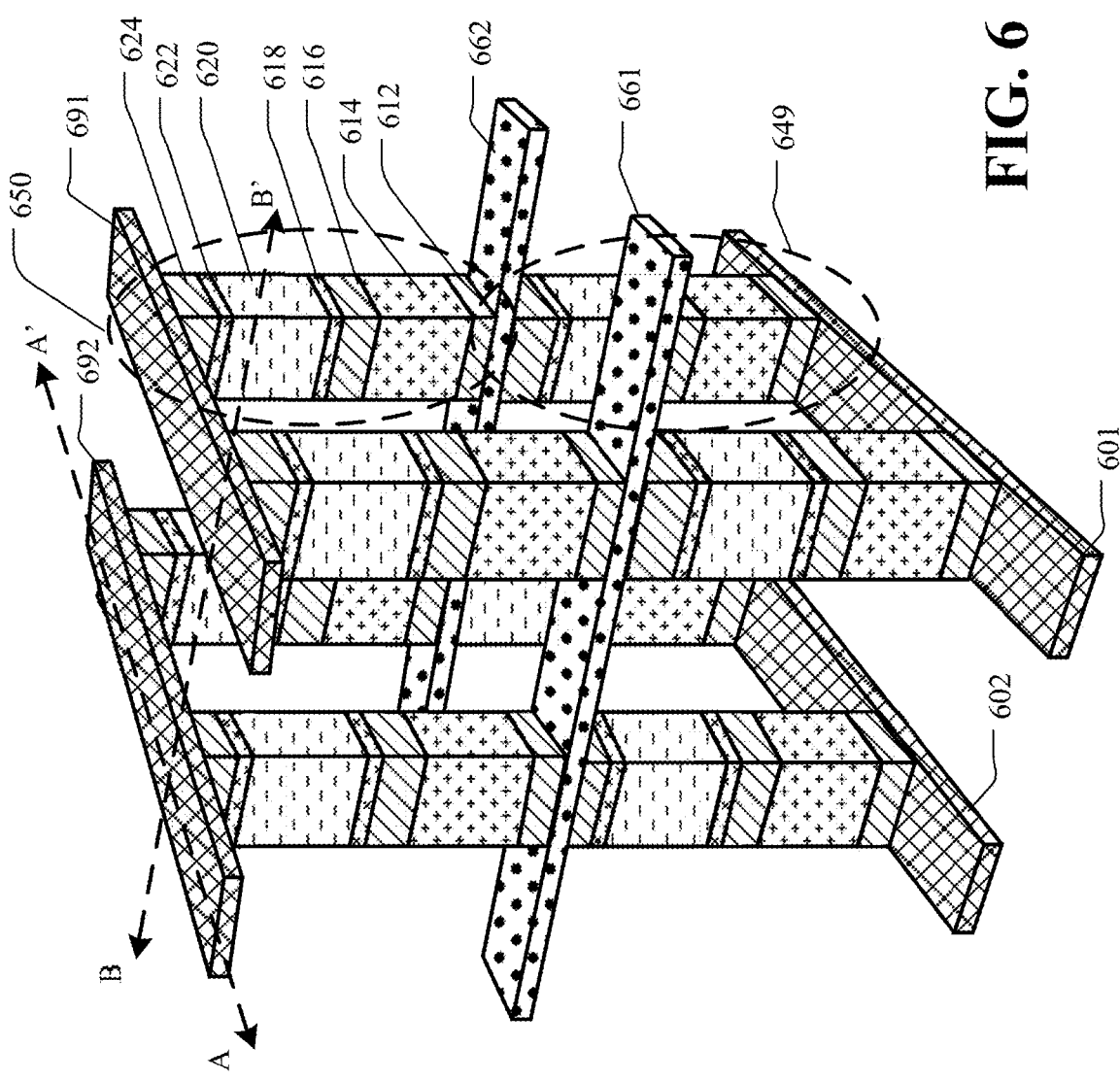
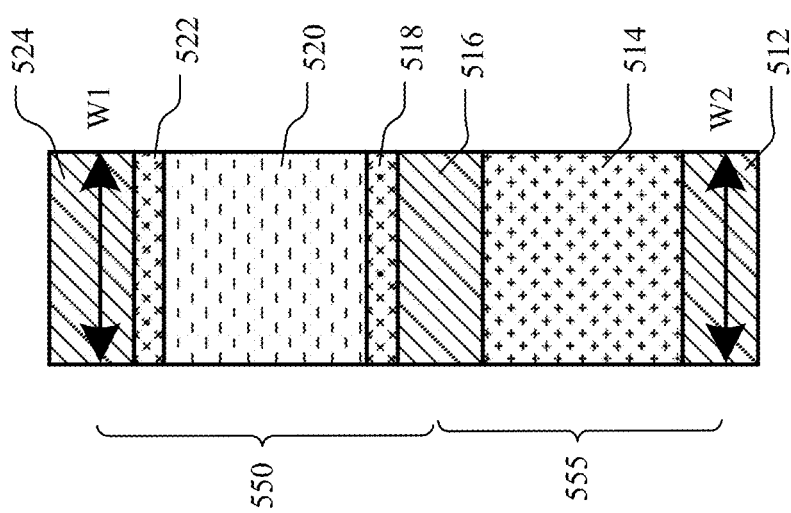

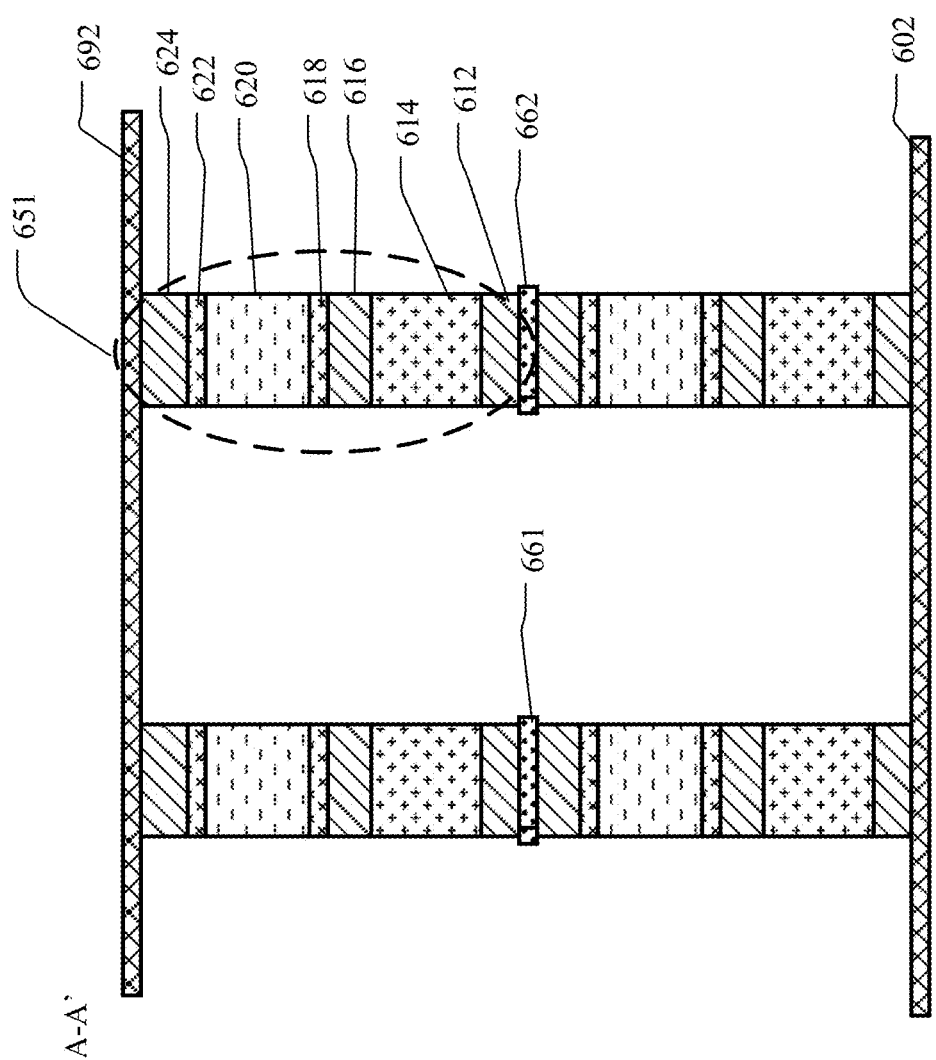

SEMICONDUCTOR DEVICE AND MEMORY CELL

PRIORITY

This application is a continuation-in-part of U.S. patent application Ser. No. 16/601,647 filed 15 Oct. 2019 (now U.S. Pat. No. 10,978,511), which application is incorporated herein by reference.

BACKGROUND

Field

The present invention relates to a memory access device.

Description of Related Art

Scaling dimensions of phase change random access memory (PCRAM) and resistive random access memory (RRAM) to achieve dense cross-point memory requires development of a selector device with a small footprint. Typically, transistors have a larger footprint and limit the memory density achievable. Two-terminal access devices are more suitable selectors for scaled memory technology.

Large cross-point memory arrays typically require large amount of the selectors. Threshold voltages of selectors can be tuned by tuning the thickness of the selector layer. However, a decrease in thickness of the selector layer can cause an increase of device leakage current (IOFF) which, in turn, can increase power consumption of the memory array.

SUMMARY

According to some embodiments of the disclosure, a semiconductor device includes a first electrode, a second electrode, and an In-doped chalcogenide-based selector layer disposed between the first electrode and the second electrode, in which the In-doped chalcogenide-based selector layer includes indium (In) in a range of about or equal to 2 at. % to about or equal to 10 at. %.

According to some embodiments of the disclosure, a memory cell, includes an access device and a phase change material disposed on the access device. The access device includes a first electrode, a second electrode, and an In-doped chalcogenide-based selector layer disposed between the first electrode and the second electrode, in which the In-doped chalcogenide-based selector layer includes indium (In) in a range of about or equal to 2 at. % to about or equal to 10 at. %.

The In-doped chalcogenide-based selector layer can improve the material stability, adhesion, and variability during the fabrication. Therefore, the semiconductor device using the In-doped chalcogenide-based selector layer may have improved yield and show less cycling degradation.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 5 is a cross-sectional view of an example memory cell with a selector, according to some embodiments of the disclosure.

FIG. 6 is a 3D perspective view of a part of a cross-point memory array including memory cells like that of FIG. 3.

FIG. 7A is a cross-sectional view on line A-A of FIG. 6.

DESCRIPTION OF THE EMBODIMENTS

Figure 1:
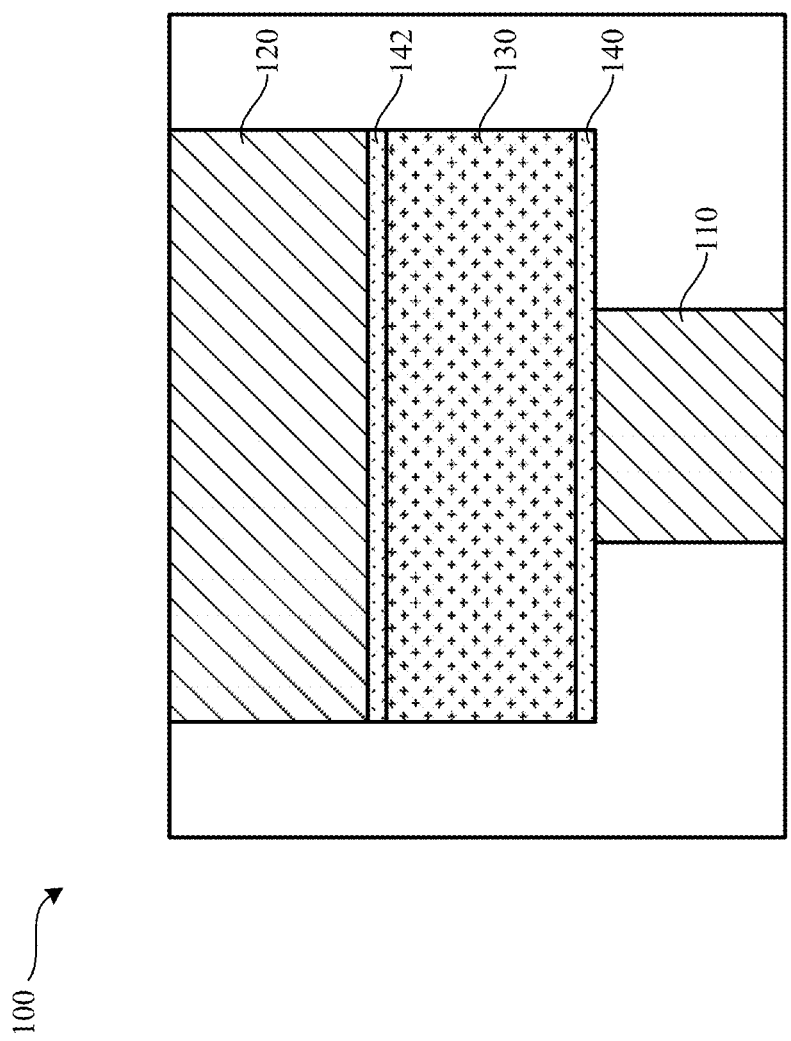
FIG. 1 is a cross-sectional view of an example selector, according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

As used herein, "around", "about" or "approximately" shall generally mean within 20 percent, preferably within 10 percent, and more preferably within 5 percent of a given value or range.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

FIG. 1 is a cross-sectional view of an example selector, according to some embodiments of the disclosure. The selector 100 includes a first electrode 110 and a second electrode 120 over the first electrode 110. In some embodiments, the material of the first electrode 110 can be the same or different from that of the second electrode 120. Examples of materials for the first electrode 110 include tungsten (W) or titanium nitride (TiN). Examples of materials for the second electrode 120 include W or titanium nitride (TiN).

The selector 100 includes an In-doped chalcogenide-based selector layer 130 sandwiched between the first electrode 110 and the second electrode 120. Example chalcogenide materials of the In-doped chalcogenide-based selector layer 130 include Arsenic (As), Germanium (Ge), Selenium (Se), and Indium (In), e.g. the In-doped chalcogenide-based selector layer 130 is an In-doped AsSeGe layer. In some embodiments, the In-doped chalcogenide-based selector layer 130 includes indium (In) (i.e., has an In compound content) in a range of about or equal to 2 at. % to about or equal to 10 at. %. If In doping amount of the In-doped chalcogenide-based selector layer 130 is too high, the leakage current (IOFF) becomes bad, and the threshold voltage (Vth) decreases accordingly.

In some embodiments, the In-doped chalcogenide-based selector layer 130 includes In in a range of about or equal to 2 at. % to about or equal to 10 at. %, As in a range of about or equal to 25 at. % to about or equal to 38 at. %, a Ge in a range of about or equal to 8 at. % to about or equal to 20 at. %, and Se in a range of about or equal to 30 at. % to about or equal to 60 at. %. More particularly, the In-doped chalcogenide-based selector layer 130 includes In in a range of 2 at. % to 10 at. %, As in a range of 25 at. % to 38 at. %, a Ge in a range of 8 at. % to 20 at. %, and Se in a range of 30 at. % to 60 at. %.

In some embodiments, the selector 100 further includes two etching stop layers 140, 142 disposed between the first electrode 110 and the In-doped chalcogenide-based selector layer 130 and between the In-doped chalcogenide-based selector layer 130 and the second electrode 120, respectively. In some embodiments, the etching stop layers 140, 142 can be carbon layers or silicon doped with carbon (Si:C) layers.

The In-doped chalcogenide-based selector layer 130 can improve the material stability, adhesion, and variability during the fabrication. Therefore, the selectors 100 using the In-doped chalcogenide-based selector layer 130 may have improved yield and show less cycling degradation. As discussed above, the In-doped chalcogenide-based selector layer 130 has the In compound content of about or equal to or equal to 2 at. % to about or equal to 10 at. %. If In doping amount of the In-doped chalcogenide-based selector layer 130 is too low, the improvement is not obvious. In some embodiments, the thickness of the In-doped chalcogenide-based selector layer 130 is about 15 nm to about 45 nm. The selector 100 that having the In-doped chalcogenide-based selector layer 130 having such thickness is still able to provide high threshold voltage and low IOFF of selectors 100 for a high density 3D cross-point array technology.

For example, in an example selector 100 that having the In-doped chalcogenide-based selector layer 130 with a thickness of about 30 nm, the threshold voltage of the selector 100 is about 3.7V, the IOFF is about 700 pA at 2V. This example selector 100 can be turned on at 10 ns, which is a very fast response speed.

An embodiment of the In-doped chalcogenide-based selector layer 130 has a thickness and concentrations of In, As, Ge and Se in amounts sufficient to have a IOFF less than 1 nA at 2V. An embodiment of the In-doped chalcogenide-based selector layer 130 has a thickness and concentrations of In, As, Ge and Se in amounts sufficient to have a IOFF less than 1 nA at 2V, and a threshold voltage greater than 3V. An embodiment of the In-doped chalcogenide-based selector layer 130 has a thickness and concentrations of In, As, Ge and Se in amounts sufficient to have an endurance of greater than $10^{10}$ cycles.

Reference is now made to FIGS. 2A-2E, in which FIGS. 2A-2E are schematic views of different stages of a manufacturing process for manufacturing the selector 100 of FIG. 1, according to some embodiments of the disclosure.

Figure 2A:
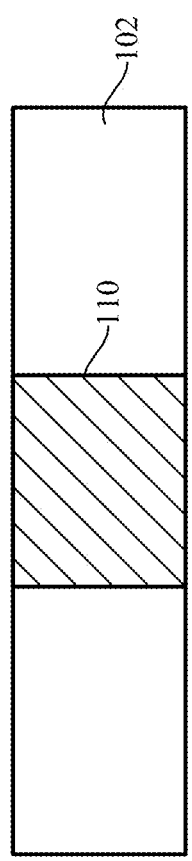
FIGS. 2A-2E are schematic views of different stages of a manufacturing process for manufacturing the selector of FIG. 1, according to some embodiments of the disclosure.

As shown in FIG. 2A, the first electrode 110 is formed extending through dielectric layer 102. The first electrode 110 extends through the dielectric layer 102 and is connected to the underlying access circuitry (not shown). The configuration of elements of the access circuitry depends upon the array configuration. Generally, example of the access circuitry may include such as transistors and diodes, word lines and sources lines, conductive plugs, and doped regions within a semiconductor substrate, etc.

In some embodiments, the dielectric layer 102 can be formed on the top surface of access circuitry. Then a photoresist layer is then deposited and patterned on the dielectric layer 102 by using photolithographic techniques so as to form a patterned photoresist layer overlying the location of the first electrode 110. Then the dielectric layer 102 is etched using the patterned photoresist layer as the mask, thereby forming a via in the dielectric layer 102. After the patterned photoresist layer is removed, a conductive material, such as W or TiN, is then filled in the via. A planarizing process is then performed to remove the portion of the conductive material exceeding the dielectric layer 102, thereby obtaining the first electrode 110 embedded in the dielectric layer 102.

Figure 2B:
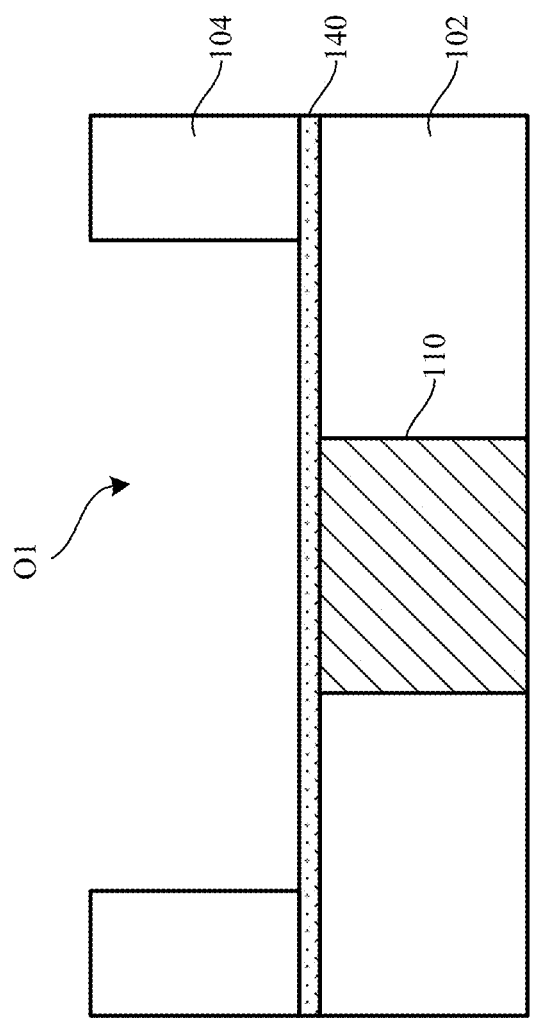

Reference is made to FIG. 2B, an etching stop layer 140 and additional dielectric layer 104 is formed over the dielectric layer 102. In some embodiments, the etching stop layer 140 includes a material that has different composition of that of the dielectric layer 104. For example, the etching stop layer 140 includes carbon, silicon doped with carbon (Si:C), or the likes, and the dielectric layers 102 and 104 includes oxide, such as silicon oxide or the likes. The etching stop layer 140 can be formed by any suitable deposition process.

The dielectric layer 104 is patterned to form an opening O1 over the first electrode 110. The step of patterning the dielectric layer 104 includes forming a patterned photoresist layer on the layer of dielectric layer 104, and then etching dielectric layer 104 by using the patterned photoresist layer as the mask, and the etching process is stop at reaching the etching stop layer 140. In some embodiments, the portion of the etching stop layer 140 uncovered by the patterned photoresist layer may be entirely consumed to expose the underlying first electrode 110. In some other embodiments, the portion of the etching stop layer 140 uncovered by the patterned photoresist layer may remain on the dielectric layer 102. The patterned photoresist layer is then removed.

Figure 2C:
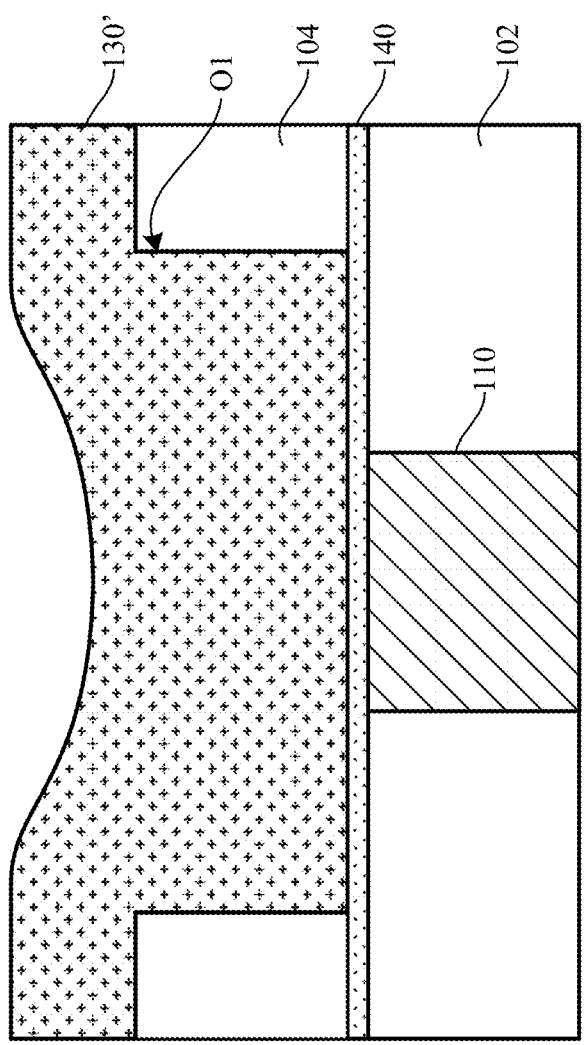
Figure 2D:
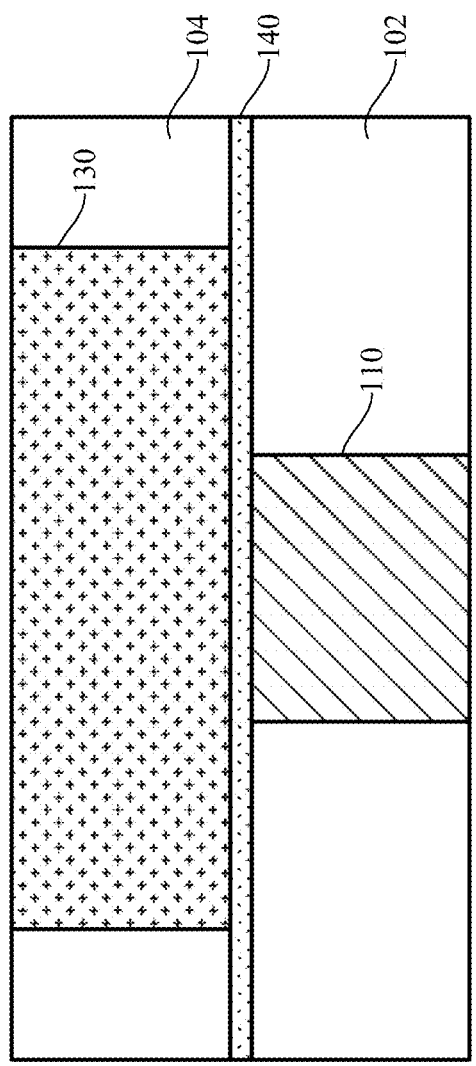

Reference is made to FIGS. 2C and 2D, a layer of In-doped chalcogenide-based material 130' is deposited and filled in the opening O1. In some embodiments, the layer of In-doped chalcogenide-based material 130' is formed by a sputter process, such as a radio frequency (RF) sputter process. A target is disposed adjacent to the substrate, such as over the first electrode 110, the dielectric layer 104, and the etching stop layer 140. The target contains material that is deposited on the substrate during the sputter process.

During the sputter process, the target is biased relative to a grounded region of the processing chamber by a power source disposed in the RF source and the direct current (DC) source. During the sputter processing, a gas is supplied to the processing chamber from a gas source via conduits. The gas source may include a non-reactive gas such as argon, krypton, helium or xenon, which is capable of energetically impinging upon and sputtering material from the target. A plasma is formed between the substrate and the target from the gas. Ions within the plasma are accelerated toward the target and cause material to become dislodged from the target. The dislodged target material is deposited on the substrate, thereby forming the layer of In-doped chalcogenide-based material 130'.

In some embodiments, the composition of the target is identical or similar to that of the layer of In-doped chalcogenide-based material 130'. In some embodiments, the materials of the target include Arsenic (As), Germanium (Ge), Selenium (Se), and Indium (In). In some embodiments, the target includes In in a range of about or equal to 2 at. % to about or equal to 10 at. %, As in a range of about or equal to 25 at. % to about or equal to 38 at. %, Ge in a range of about or equal to 8 at. % to about or equal to 20 at. %, and Se in a range of about or equal to 30 at. % to about or equal to 60 at. %.

After the layer of In-doped chalcogenide-based material 130' is deposited and filling the opening O1, a planarizing process is then performed to remove the portion of the In-doped chalcogenide-based material 130' exceeding the dielectric layer 104, thereby obtaining the In-doped chalcogenide-based selector layer 130 embedded in the dielectric layer 104. In some embodiments, the thickness of the In-doped chalcogenide-based selector layer 130 is about 15 nm to about 45 nm.

Figure 2E:
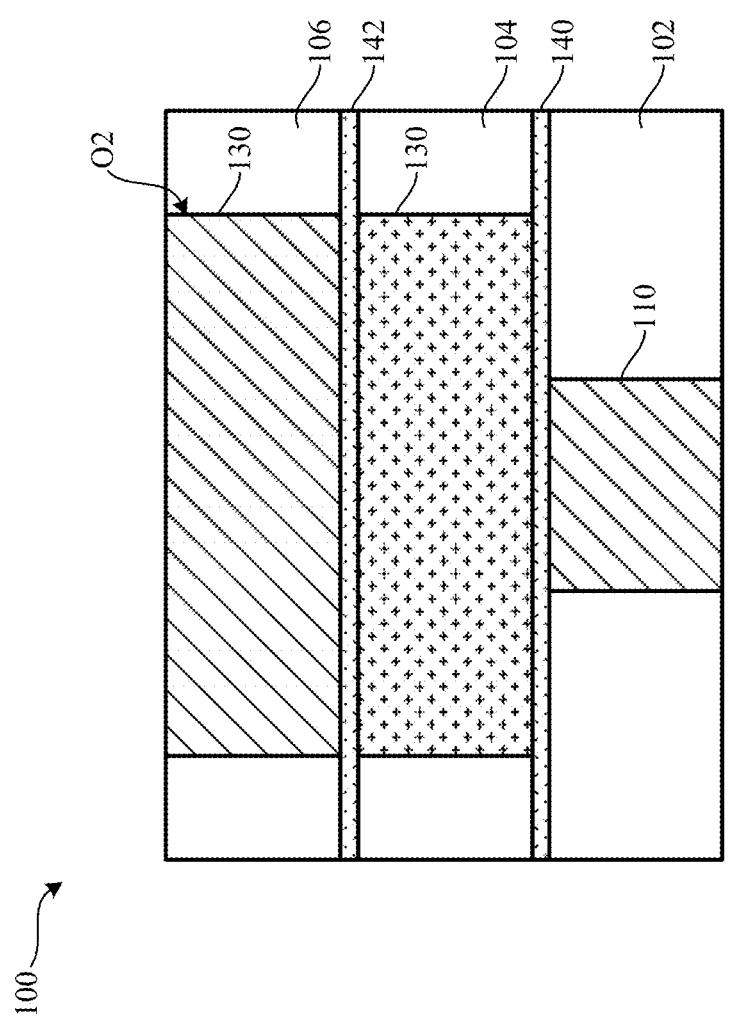

Reference is made to FIG. 2E, the second electrode 120 is formed on the In-doped chalcogenide-based selector layer 130. In some embodiments, the etching stop layer 142 is formed on the In-doped chalcogenide-based selector layer 130 and the dielectric layer 104, and an additional dielectric layer 106 is formed on the etching stop layer 142 and is patterned to form an opening O2 over the In-doped chalcogenide-based selector layer 130. The step of patterning the dielectric layer 106 includes forming a patterned photoresist layer on the dielectric layer 106, and then etching dielectric layer 106 by using the patterned photoresist layer as the mask, and the etching process is stop at reaching the etching stop layer 142. The portion of the etching stop layer 142 uncovered by the patterned mask may be entirely consumed or partially remained on the dielectric layer 104. The patterned photoresist layer is then removed.

After the patterned photoresist layer is removed, a conductive material, such as W or TiN, is then filled in the opening O2. A planarizing process is then performed to remove the portion of the conductive material exceeding the dielectric layer 106, thereby obtaining the second electrode 120 embedded in the dielectric layer 106 and on the In-doped chalcogenide-based selector layer 130.

In some embodiments, the width of the In-doped chalcogenide-based selector layer 130 and the width of the second electrode 120 are substantially the same, and the width of the first electrode 110 is smaller than the width of the In-doped chalcogenide-based selector layer 130 and the second electrode 120 thereon. In some other embodiments, the widths of the first electrode 110, the In-doped chalcogenide-based selector layer 130, and the second electrode 120 are substantially the same.

Figure 3:
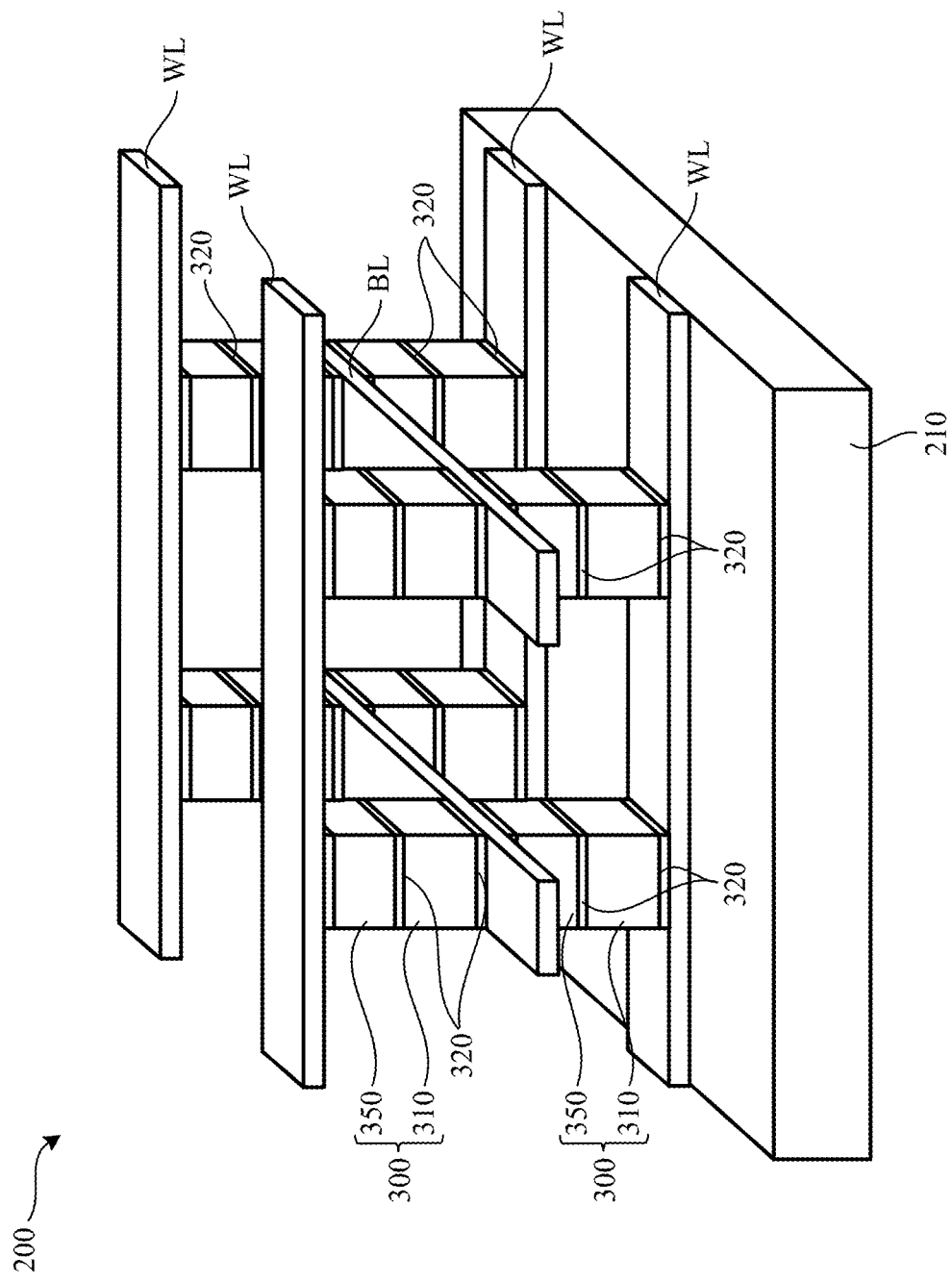
FIG. 3 is a schematic 3D stack view of a device according to some embodiments of the disclosure.

FIG. 3 is a perspective view of 3D multilayer, cross-point memory device 200, according to some embodiments of the disclosure. The device 200 includes an array of memory cells 300 over a substrate 210. The substrate 210 includes a semiconductor substrate, or a semiconductor substrate having circuits thereon. In some embodiments, the substrate 210 is a back end of line (BEOL) substrate or a front end of line (FEOL) substrate.

Each memory cell 300 in the array includes an access device 310 and a memory layer 350, and the access device 310 and the memory layer 350 are in form of a pillar, which can be prism-like or cylinder-like. Bit lines BLs, which are conductive lines, are connected to first and second groups of memory cells 300 on the upper and lower levels of the 3D stack, and word lines WLs, which are conductive lines, running perpendicular to the bit lines BLs, are connected first groups of memory cells in the top layer, and to second groups of memory cells 300 in the bottom layer. The access device 310 includes the In-doped chalcogenide-based selector layer which comprise an ovonic threshold switch. In some embodiments, the In-doped chalcogenide-based selector layer includes In in a range of about or equal to 2 at. % to about or equal to 10 at. %. If In doping amount of the In-doped chalcogenide-based selector layer is too high, the leakage current becomes bad, and the threshold voltage decreases accordingly. In some embodiments, the In-doped chalcogenide-based selector layer includes In in a range of about or equal to 2 at. % to about or equal to 10 at. %, As in a range of about or equal to 25 at. % to about or equal to 38 at. %, Ge in a range of about or equal to 8 at. % to about or equal to 20 at. %, and Se in a range of about or equal to 30 at. % to about or equal to 60 at. %.

The memory layer 350 can comprise a layer of programmable resistance material. In one example, the memory layer 350 comprises a phase change memory material 454. In some embodiments, other programmable resistance memory elements can be implemented, such as metal-oxide resistive memories, magnetic resistive memories and conducting-bridge resistive memories, or other types of memory devices.

Embodiments of materials for the memory layer 350 can include chalcogenide-based materials and other materials. A chalcogenide-based material suitable for use as a memory element can contain one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be for example dielectric doped Ge2Sb2Te5, GeSb2Te4 and GeSb4Te7. In some embodiments, a transition metal such as chromium (Cr), iron (Fe), nickel (Ni), niobium (Nb), palladium (Pd), platinum (Pt) and mixtures or alloys thereof may be combined with Ge/Sb/Te or Ga/Sb/Te to form a phase change alloy that has programmable resistive properties. Specific examples of memory materials that may be useful are disclosed in Ovshinsky, U.S. Pat. No. 5,687,112 at columns 11-13, which examples are incorporated by reference.

The memory layer 350 can comprise a layer of chalcogenide alloy with additives to modify conductivity, transition temperature, melting temperature, and other properties. Representative additives can include nitrogen (N), silicon (Si), oxygen (O), silicon dioxide (SiOx), silicon nitride (SiN), copper (Cu), silver (Ag), gold (Au), aluminum (Al), aluminum oxide (Al2O3), tantalum (Ta), tantalum oxide (TaOx), tantalum nitride (TaN), titanium (Ti), and titanium oxide (TiOx).

In some embodiments, the memory cells 300 may be vertically stacked in a three-dimensional memory array. A dielectric layer is formed surrounding the memory cells 300. In some embodiments, one memory cell 300 may be vertically stacked above another memory cell 300 and are spaced apart from each other by the dielectric layer. In some embodiments, etching stop layers 320 are interposed between the access device 310 and the memory layer 350, and between the conductive lines, e.g. the word lines WL or the bit lines BL, and the memory layer 350 and the access device 310. The etching stop layers 320 can be layers that include carbon or silicon doped with carbon (Si:C).

Thus, array of memory cells 300 is disclosed, in which each of the memory cells 300 includes a one-selector one-resistor (1S1R) semiconductor structure. The memory cells 300 of one-selector one-resistor structure allow high density and monolithic 3D integration. Additionally, by introducing the In-doped chalcogenide-based selector layer into the access device 310, the memory cells 300 may have high threshold voltage, low IOFF, and high endurance performance for high density 3D cross point technology. For example, the threshold voltage for switching on the ovonic threshold switch can be greater than 3V for a device using In-doped chalcogenide-based selector layer with 30 nm thickness, IOFF can be less than 1 nA with a voltage across the ovonic threshold switch of about 2V, the endurance can be greater than 1E10 cycles. The In-doped chalcogenide-based selector layer can improve the material stability, adhesion, and variability during the fabrication, thus cell to cell variation becomes small, yield is improved, and cycle to cycle degradation becomes less.

Figure 4A:
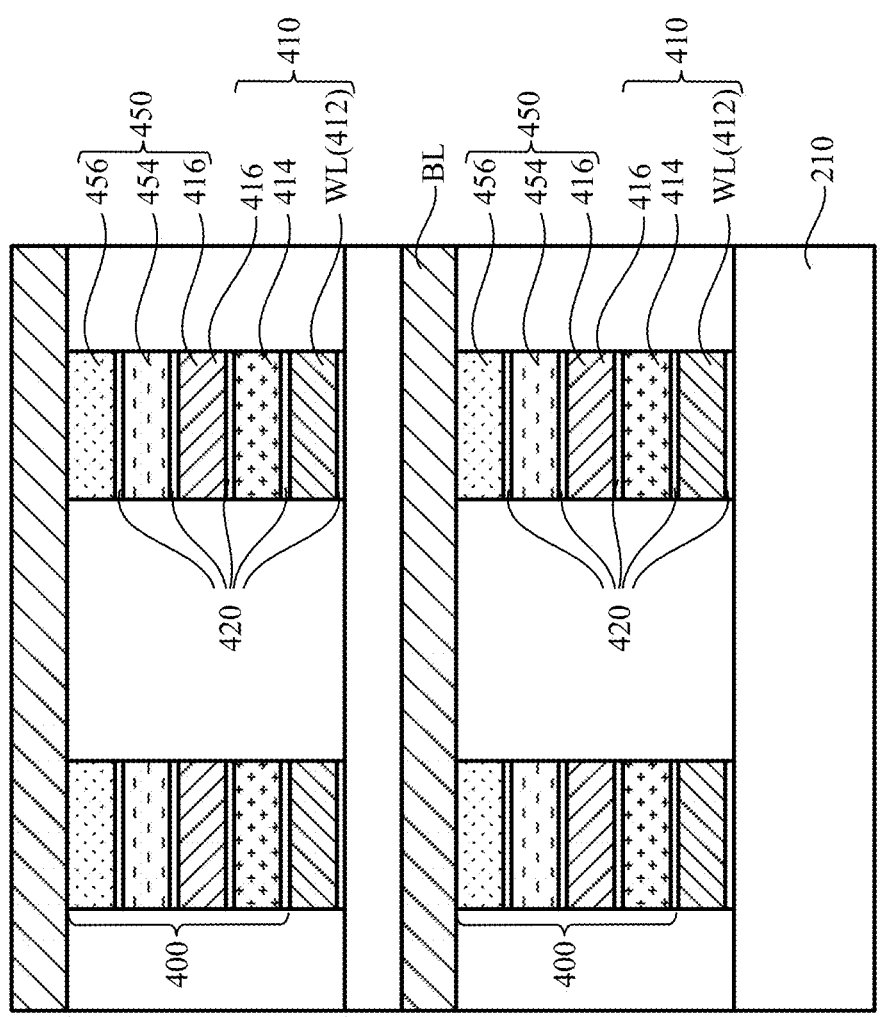
FIG. 4A is a cross-sectional view shows one stack of the first groups of the memory cells along a plane, according to some other embodiments.
Figure 4B:
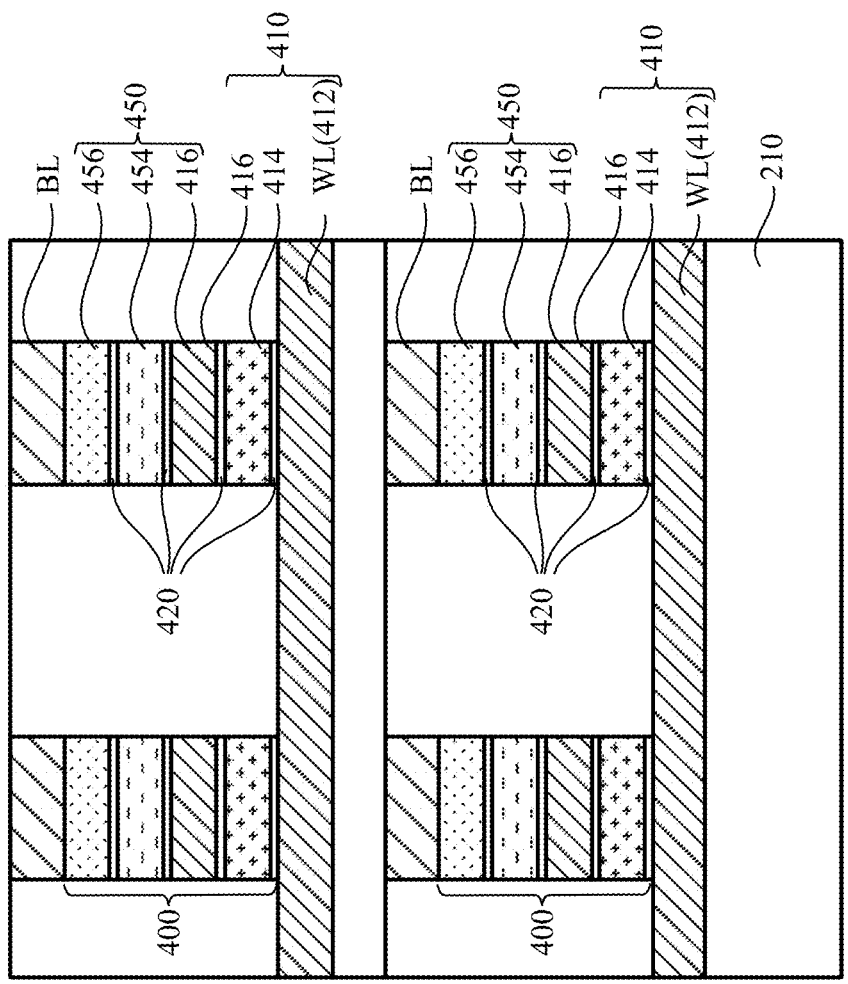
FIG. 4B is a cross-sectional view shows one stack of the second groups of the memory cells along another plane, according to some other embodiments.

Reference is made to FIG. 4A and FIG. 4B. FIG. 4A and FIG. 4B respectively are cross-sectional views that show one stack of the first groups of the memory cells 400 along different planes, according to some other embodiments. In the illustrated embodiment, each level of the 3D array includes a bit line BL and a word line WL, separate from the bit line and word line of adjacent levels.

Each of the word line WL extends along a first direction and connects the second group of memory cells 400 in parallel. The word line WL also serves as a first electrode 412 of each of the access device 410. An In-doped chalcogenide-based selector layer 414 is formed on the first electrode 412 of each of the access device 410. The In-doped chalcogenide-based selector layer 414 includes chalcogenide materials, such as Arsenic (As), Germanium (Ge), Selenium (Se), and Indium (In). In some embodiments, In-doped chalcogenide-based selector layer 414 is In-doped AsSeGe layer. In some embodiments, the In-doped chalcogenide-based selector layer 414 includes In in a range of about or equal to 2 at. % to about or equal to 10 at. %. If In doping amount of the In-doped chalcogenide-based selector layer 414 is too high, the IOFF becomes bad, and the threshold voltage decreases accordingly.

In some embodiments, the In-doped chalcogenide-based selector layer 414 includes In in a range of about or equal to 2 at. % to about or equal to 10 at. %, As in a range of about or equal to 25 at. % to about or equal to 38 at. %, Ge in a range of about or equal to 8 at. % to about or equal to 20 at. %, and Se in a range of about or equal to 30 at. % to about or equal to 60 at. %. In some embodiments, the thickness of the In-doped chalcogenide-based selector layer 414 is about 15 nm to about 45 nm.

A second electrode 416 is formed on the In-doped chalcogenide-based selector layer 414. The first electrode 412 and the second electrode 416 include conductive material such as W or TiN. In some embodiments, the In-doped chalcogenide-based selector layer 414 is physically and electrically in contact with the first electrode 412 and the second electrode 416. In some other embodiments, additional layers, such as etching stop layers, thermal layers, work function layers, or other suitable layers can be interposed between the first electrode 412, the In-doped chalcogenide-based selector layer 414, and the second electrode 416. The steps of manufacturing of the access device 410 are similar to that as discussed in FIG. 2A to FIG. 2E.

The second electrode 416 also serves as a bottom electrode of the memory layer 450. The memory layer 450 is electrically coupled to the access device 410 and is programmable to at least two resistive states. In some embodiments, the memory layer 450 includes a phase change material (PCM) 454 or other memory material. The memory layer 450 is electrically connected to the second electrode 416. The phase change material 454 may be a material programmable to either a first phase having a first electrical resistance or a second phase having a second electrical resistance, where the first electrical resistance is greater than the second electrical resistance.

In some embodiments, the array of memory cells 400 is a multi-bit memory array. Thus, the phase change material 454 or other memory material is programmed to one of at least three resistance levels. Also, other programmable resistance memory materials can be used as discussed above.

Each bit line BL extends along a second direction and connects the first group of memory cells 400 in parallel. The top electrode 456 of the memory 450 is disposed on the phase change material 454, or other memory material, and is connected to the bit line BL.

In some embodiments, etching stop layers 420 are interposed between the word line WL (the first electrode 412) and the In-doped chalcogenide-based selector layer 414, and between the selector layer 414 and the second electrode 416. Also, etching stop layer 420 are interposed between the second electrode and the phase change material 454. Also, etching stop layers 420 are interposed between the phase change material 454, and the top electrode 456. The etching stop layers 420 can be layers that include carbon or silicon doped with carbon (Si:C).

FIG. 5 illustrates a stack of materials according to another embodiment configured as a memory cell, including an access device 555 and a memory layer 550. The stack can be configured as a pillar in a crosspoint memory array.

The access device in this embodiment is an ovonic threshold switch including a first etching stop layer 512 (first electrode), an In-doped chalcogenide-based selector layer 514, and a second etching stop layer 516 (second electrode). The memory layer comprises a first barrier layer 518 on the second etching stop layer 516, a layer of memory material 520 such as a phase change material on the first barrier layer 518, a second barrier layer 522 on the layer of memory material 520, and a top etching stop layer 524 (top electrode) on the second barrier layer. The electrodes 512, 516, 524 can comprise a metal such as tungsten or titanium nitride as discussed above. The layer of memory material 520 can comprise a phase change memory material, or other materials, examples of which are described above.

The width (W1) orthogonal to the current flow direction, of the top etching stop layer 524 can be less than the width (W2) of bottom etching stop layer 512, in some embodiments.

A phase change memory material can be, for example, a layer of chalcogenide having a thickness of about 10 nm to about 50 nm, preferably about 30 nm to about 40 nm. Chalcogenides utilized as phase change memory elements are capable of being switched between a relatively low resistance state, amorphous phase, and a relatively high resistance state, crystalline phase, by application of energy such as heat or electrical current. In some embodiments, multilevel cells having multiple resistance states can be used.

The barrier layers can have thickness in a range from 2 nm to 10 nm. Example materials for the barrier layers 518, 522 can be a metal nitride, such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (WAlN), tantalum silicon nitride (TaSiN), tantalum aluminum nitride (TaAlN). In addition to metal nitrides, the barrier layers can comprise materials such as carbon, doped polysilicon, tungsten (W), copper (Cu), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON). In some embodiments, the preferred material for the barrier layers 518 and 522 is tungsten.

FIG. 6, which is a schematic 3D cross point memory device, according to some embodiments of the disclosure. The cross point memory device includes an array of memory cells like that of FIG. 5, over a substrate. The substrate can include a semiconductor substrate, or a semiconductor substrate having circuits thereon. In some embodiments, the substrate is a back end of line (BEOL) substrate or a front end of line (FEOL) substrate. A plurality of word lines 601 and 602 are disposed on a bottom level. A plurality of bit lines 661, 662 are disposed in an intermediate level. A second plurality of word lines are disposed in an upper level in this portion of the array. Memory cells (e.g. memory cell 650 between bit line 662 and word line 691) are disposed in the cross points of the bit lines and the word lines. Also, memory cells (e.g. 650) in the upper level share bit lines with memory cells (e.g. 649) in the lower level.

As in FIG. 6, each memory cell (e.g. 650) in the array includes an access device (e.g. 555) and a memory layer (e.g. 550). In the illustrated embodiment, the memory cells are oriented such that the access device is below the memory layer. In other embodiments, the memory cells can be arranged so that the upper level has access devices above the memory layer, and the lower level has access devices below the memory layer.

The access device in this embodiment is an ovonic threshold switch including a first electrode 612, an In-doped chalcogenide-based selector layer 614, and a second electrode 616. The memory layer comprises a first barrier layer 618 on the second electrode 616, a layer of memory material 620 such as a phase change material on the first barrier layer 618, a second barrier layer 622 on the layer of memory material 620, and a top electrode 624 on the second barrier layer. The electrodes 612, 616, 624 can comprise a metal such as tungsten or titanium nitride as discussed above. The electrodes 612, 616, 624 can comprise amorphous carbon in some embodiments. The thickness of the electrodes 612, 616, 624 can be in a range from 10 nm to 20 nm. The layer of memory material 620 can comprise a phase change memory material, or other materials, examples of which are described above.

In some embodiments, the In-doped chalcogenide-based selector layer 614 is physically and electrically in contact with the first electrode 612 and the second electrode 616. In some other embodiments, additional layers, such as etching stop layers, thermal layers, work function layers, or other suitable layers can be interposed between the first electrode 612, the In-doped chalcogenide-based selector layer 614, and the second electrode 616.

The access device and the memory layer of the memory cell are in form of a cylinder-like or prism-like pillar. Bit lines BLs, which are conductive lines, are connected to first groups (columns) of memory cells, and word lines WLs, which are conductive lines, running perpendicular to the bit lines BLs, are connected to second groups (rows) of memory cells. The access device includes the In-doped chalcogenide-based selector layer.

As described above, in some embodiments, the In-doped chalcogenide-based selector layer includes In in a range of about or equal to 2 at. % to about or equal to 10 at. %. If In doping amount of the In-doped chalcogenide-based selector layer is too high, the leakage current becomes bad, and the threshold voltage may decrease. In some embodiments, the In-doped chalcogenide-based selector layer includes In in a range of about or equal to 2 at. % to about or equal to 10 at. %, As in a range of about or equal to 25 at. % to about or equal to 38 at. %, Ge in a range of about or equal to 8 at. % to about or equal to 20 at. %, and Se in a range of about or equal to 30 at. % to about or equal to 60 at. %.

In some embodiments, the thickness of the In-doped chalcogenide-based selector layer 614 is about 15 nm to about 45 nm.

The second electrode 616 and barrier layer 618 also serve as a bottom electrode of the memory cell 650. The memory layer 620 is electrically coupled to, and in electrical series with, the access device 610 and is programmable to at least two resistive states. In some embodiments, the memory layer 620 includes a phase change material (PCM) on the barrier layer 618. The phase change material may be a material programmable to either a first phase having a first electrical resistance or a second phase having a second electrical resistance, where the first electrical resistance is greater than the second electrical resistance.

FIG. 7A is a cross-section taken on the line A-A in the structure shown in FIG. 6. Thus, a cross-section extends along bit line 602 and bit line 692, and crosses word lines 661 and 662. Memory cell 651 is disposed at the cross point of, and in electrical series between, bit line 662 and word line 692. Memory cell 651 is the same structure as that described with reference to FIG. 7, and the same reference numerals are utilized.

Figure 7B:
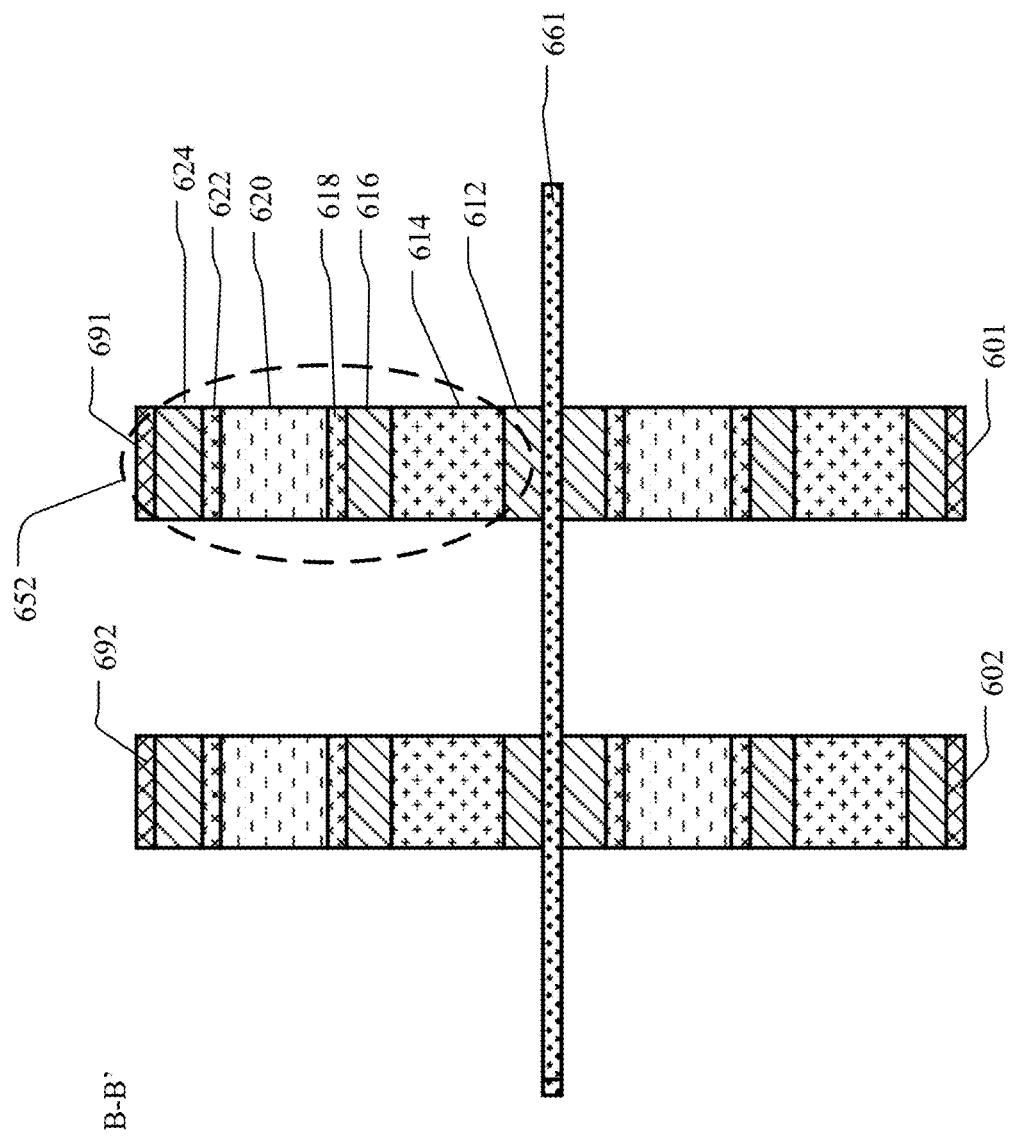
FIG. 7B is a cross-sectional view on line B-B of FIG. 6.

FIG. 7B is a cross-section taken on the line B-B in the structure shown in FIG. 6. Thus, the cross-section crosses word lines 601, 602, 691 and 692, and extends along bit line 661. Memory cell 652 is disposed at the cross point of, and in electrical series between, bit line 661 and word line 691. Memory cell 651 is the same structure as that described with reference to FIG. 7, and the same reference numerals are utilized.

FIGS. 3 and 7 illustrate examples of a cross-point memory comprising a plurality of word lines in a first level; a plurality of bit lines in a second level over the first level orthogonal to the plurality of word line in the first level; a plurality of word lines in a third level over the second level parallel to the plurality of word lines in the first level; a first array of memory cells at cross-points of the plurality of word lines in the first level and the plurality of bit lines in the second level; and a second array of memory cells at cross-points of the plurality of bit lines in the second level and the plurality of word lines in the third level. The memory cells in the first array and in the second array comprise an access device, comprising a first electrode, a second electrode, and an In-doped chalcogenide-based selector layer disposed between the first electrode and the second electrode, wherein the In-doped chalcogenide-based selector layer includes In in a range of about 2 at. % to about 10 at. % and a memory material in electrical series between a corresponding word line and a corresponding bit line.

Thus, an array of memory cells is disclosed, in which each of the memory cells includes a one-selector one-resistor (1S1R) structure. The memory cells of one-selector one-resistor structure allow high density and monolithic 3D integration. Additionally, by introducing the In-doped chalcogenide-based selector layer into the access device, the memory cells may have high threshold voltage, low IOFF, and high endurance performance for high density 3D cross point technology. For example, the threshold voltage of the memory cell can be greater than 3V for a device using In-doped chalcogenide-based selector layer with 30 nm thickness, IOFF can be less than 1 nA at 2V, the endurance can be greater than 1E10 cycles. The In-doped chalcogenide-based selector layer can improve the material stability, adhesion, and variability during the fabrication, thus cell to cell variation becomes small, yield is improved, and cycle to cycle degradation becomes less.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. An ovonic threshold switch, comprising:
a first electrode, a second electrode, and an In-doped chalcogenide-based selector layer including In in a range of 2 at. % to 10 at. %, wherein:
the In-doped chalcogenide-based selector layer is an In-doped AsSeGe layer; and
the In-doped chalcogenide-based selector layer includes As in a range of 25 at. % to 38 at. %, Ge in a range of 8 at. % to 20 at. %, and Se in a range of 30 at. % to 60 at. %.

2. The ovonic threshold switch of claim 1, wherein a thickness of the In-doped chalcogenide-based selector layer is about 15 nm to about 45 nm.

3. The ovonic threshold switch of claim 1, wherein the In-doped chalcogenide-based selector layer has a thickness and concentrations of In, As, Ge and Se in amounts sufficient to have an IOFF less than 1 nA at 2V.

4. The ovonic threshold switch of claim 1, wherein the In-doped chalcogenide-based selector layer has a thickness and concentrations of In, As, Ge and Se in amounts sufficient to have an IOFF less than 1 nA at 2V, and a threshold voltage greater than 3V.

5. The ovonic threshold switch of claim 1, wherein the In-doped chalcogenide-based selector layer has a thickness and concentrations of In, As, Ge and Se in amounts sufficient to have an endurance of greater than $10^{10}$ cycles.

6. A memory cell, comprising:
an access device, comprising a first electrode, a second electrode, and an In-doped chalcogenide-based selector layer disposed between the first electrode and the second electrode, wherein:
the In-doped chalcogenide-based selector layer is an In-doped AsSeGe layer;
the In-doped chalcogenide-based selector layer includes As in a range of about 25 at. % to about 38 at. %, Ge in a range of about 8 at. % to about 20 at. %, and Se in a range of about 30 at. % to about 60 at. %; and
the In-doped chalcogenide-based selector layer includes In in a range of about 2 at. % to about 10 at. %; and
a memory material in electrical series with the access device.

7. The memory cell of claim 6, wherein a thickness of the In-doped chalcogenide-based selector layer is about 15 nm to about 45 nm.

8. The memory cell of claim 6, including a barrier layer between the second electrode and the memory material.

9. The memory cell of claim 8, including a top electrode in series with the memory material and the second electrode, and a second barrier layer between the memory material and the top electrode.

10. A memory comprising:
a plurality of word lines in a first level;
a plurality of bit lines in a second level over the first level orthogonal to the plurality of word line in the first level;
a plurality of word lines in a third level over the second level parallel to the plurality of word lines in the first level;
a first array of memory cells at cross-points of the plurality of word lines in the first level and the plurality of bit lines in the second level; and
a second array of memory cells at cross-points of the plurality of bit lines in the second level and the plurality of word lines in the third level;
wherein:
memory cells in the first array and in the second array comprise an access device, comprising a first electrode, a second electrode, and an In-doped chalcogenide-based selector layer disposed between the first electrode and the second electrode and a memory material in electrical series between a corresponding word line and a corresponding bit line;
the In-doped chalcogenide-based selector layer is an In-doped AsSeGe layer;
the In-doped chalcogenide-based selector layer includes As in a range of about 25 at. % to about 38 at. %, Ge in a range of about 8 at. % to about 20 at. %, and Se in a range of about 30 at. % to about 60 at. %; and
the In-doped chalcogenide-based selector layer includes In in a range of about 2 at. % to about 10 at. %.

11. The memory of claim 10, wherein a thickness of the In-doped chalcogenide-based selector layer is about 15 nm to about 45 nm.

12. The memory of claim 10, wherein bit lines in the plurality of bit lines in the second layer are connected to memory cells in the first array and to memory cells in the second array.

13. The memory of claim 10, including a barrier layer between the second electrode and the memory material.

14. The memory of claim 13, including a top electrode in series with the memory material, and second barrier layer between the memory material and the top electrode.

* * * * *